United States Patent
Song et al.

(10) Patent No.: US 10,897,032 B2
(45) Date of Patent: Jan. 19, 2021

(54) JIG FOR ASSEMBLY OF BATTERY MODULE

(71) Applicant: LG CHEM, LTD., Seoul (KR)

(72) Inventors: Song Yi Song, Daejeon (KR); Ju Hwan Baek, Daejeon (KR); Heung Kun Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 38 days.

(21) Appl. No.: 16/537,440

(22) Filed: Aug. 9, 2019

(65) Prior Publication Data

US 2020/0083500 A1  Mar. 12, 2020

(30) Foreign Application Priority Data

Sep. 10, 2018  (KR) .................. 10-2018-0108014

(51) Int. Cl.
*H01M 2/10* (2006.01)
*H01M 10/42* (2006.01)
*H05K 1/18* (2006.01)

(52) U.S. Cl.
CPC ..... *H01M 2/1016* (2013.01); *H01M 10/4257* (2013.01); *H05K 1/181* (2013.01); *H05K 2201/10037* (2013.01)

(58) Field of Classification Search
CPC .......... H01M 2/1016; H01M 10/4257; H01M 2/1077; H01M 2/206; H01M 10/425; H05K 2201/10037; H05K 1/181
See application file for complete search history.

(56) References Cited

U.S. PATENT DOCUMENTS

| | | | |
|---|---|---|---|
| 9,077,020 B2 | 7/2015 | Kim | |
| 2013/0143082 A1 | 6/2013 | Kim | |
| 2018/0205107 A1* | 7/2018 | Lee | ........................ B29C 33/308 |

FOREIGN PATENT DOCUMENTS

| | | |
|---|---|---|
| JP | 2011-210529 A | 10/2011 |
| KR | 10-2012-0051808 A | 5/2012 |
| KR | 10-2013-0061375 A | 6/2013 |
| KR | 10-2015-0141810 A | 12/2015 |
| KR | 10-2015-0141811 A | 12/2015 |
| KR | 10-2017-0048804 A | 5/2017 |
| KR | 10-2017-0048819 A | 5/2017 |
| KR | 10-2018-0092595 A | 8/2018 |

\* cited by examiner

*Primary Examiner* — Stewart A Fraser
(74) *Attorney, Agent, or Firm* — Birch, Stewart, Kolasch & Birch, LLP

(57) ABSTRACT

Disclosed herein is a jig for assembly of a battery module, the jig including a housing having a first accommodation portion configured to accommodate a battery cell and a second accommodation portion disposed so as to be spaced apart from the first accommodation portion, the second accommodation portion being configured to accommodate a circuit board in the state of being spaced apart from the battery cell, wherein the battery cell is accommodated in the first accommodation portion, and the circuit board is accommodated in the second accommodation portion, whereby the orientation of the circuit board with respect to the battery cell may be maintained.

13 Claims, 8 Drawing Sheets

[FIG. 1]
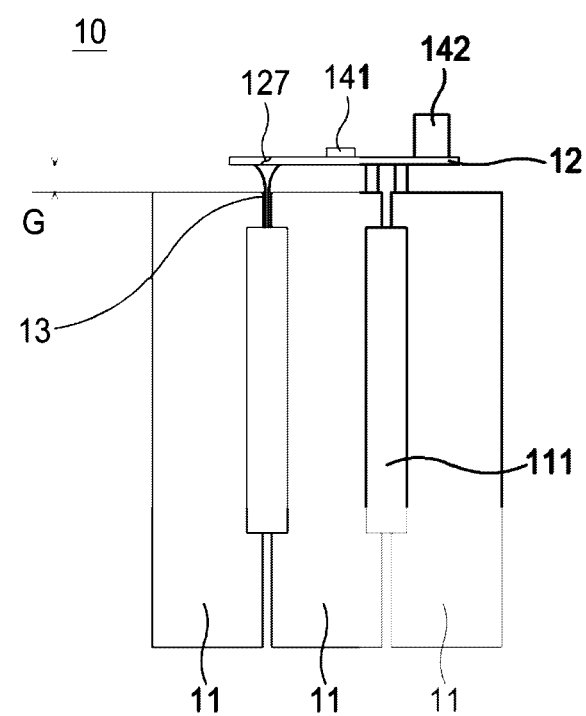

[FIG. 2]
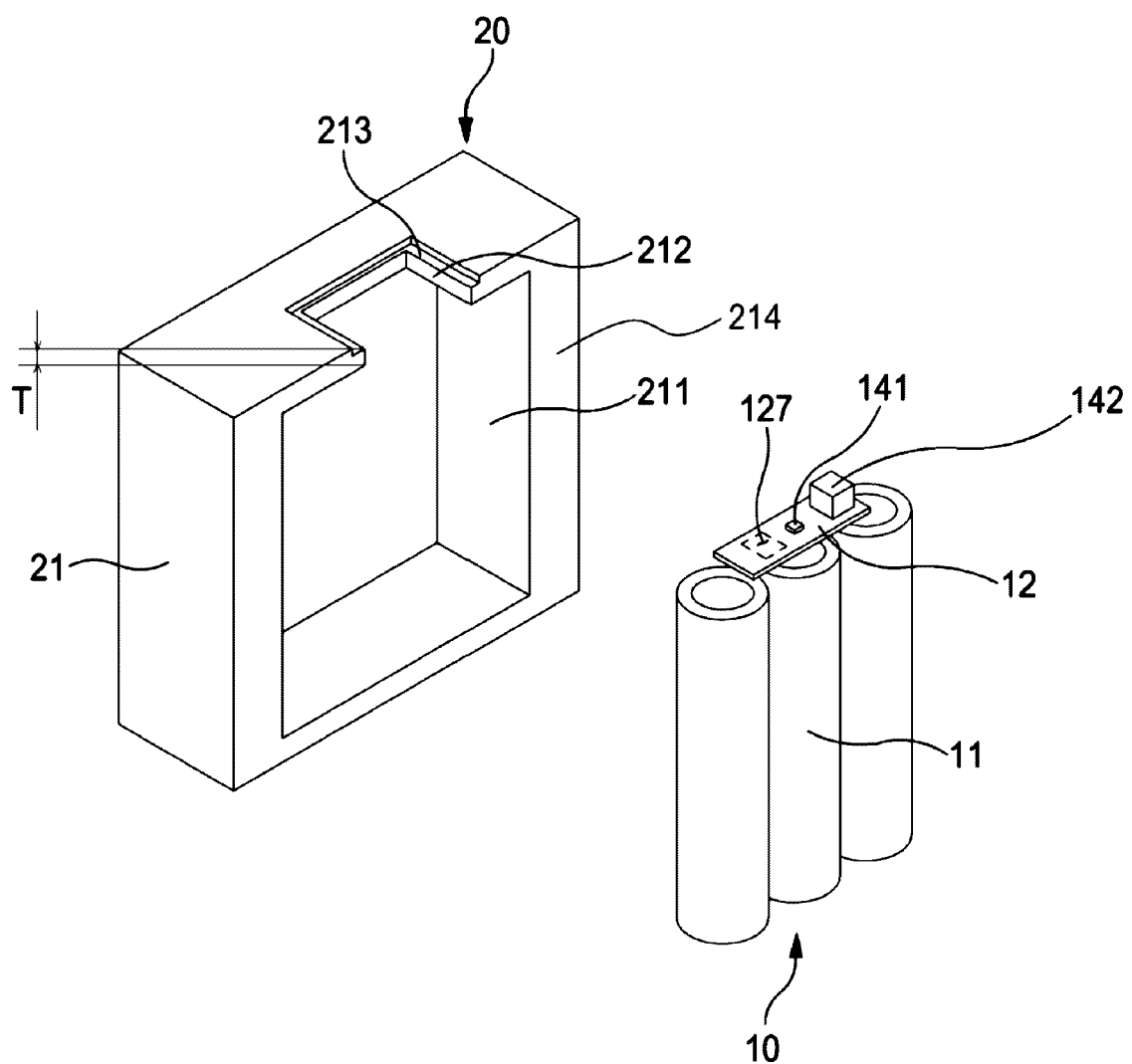

[FIG. 3]
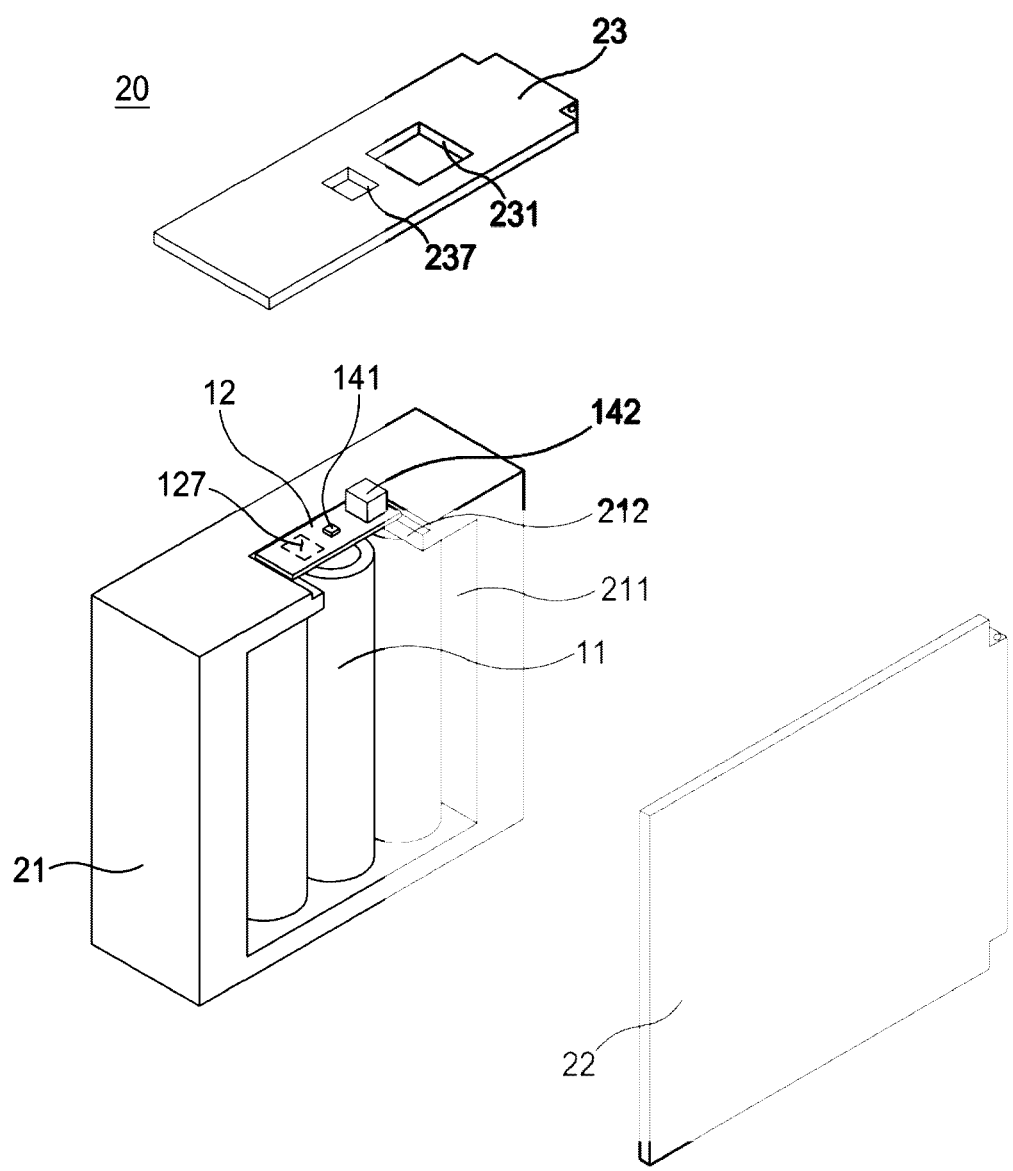

[FIG. 4]
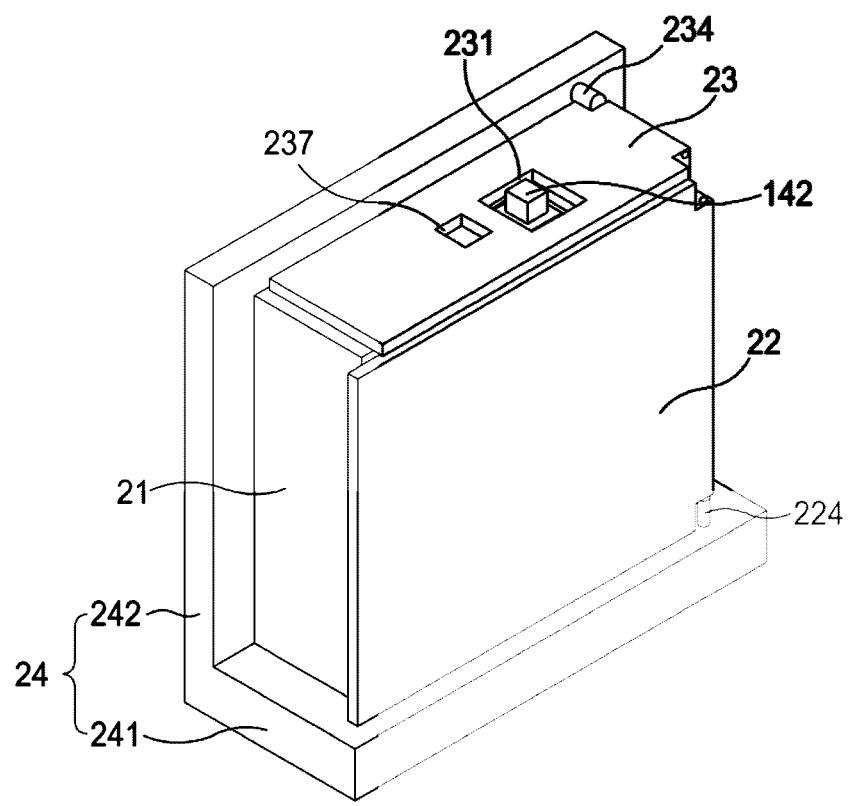

[FIG. 5]
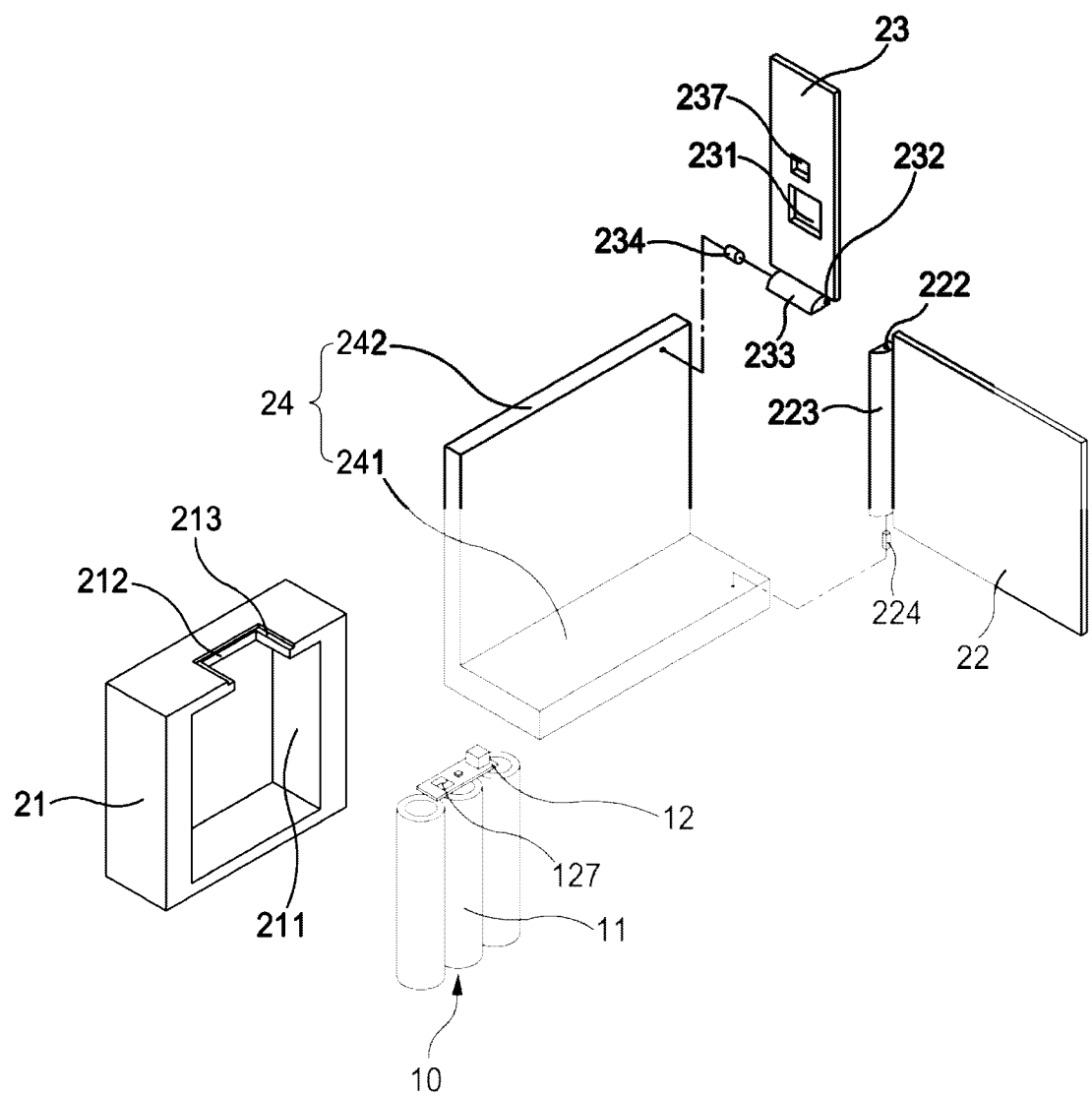

[FIG. 6]
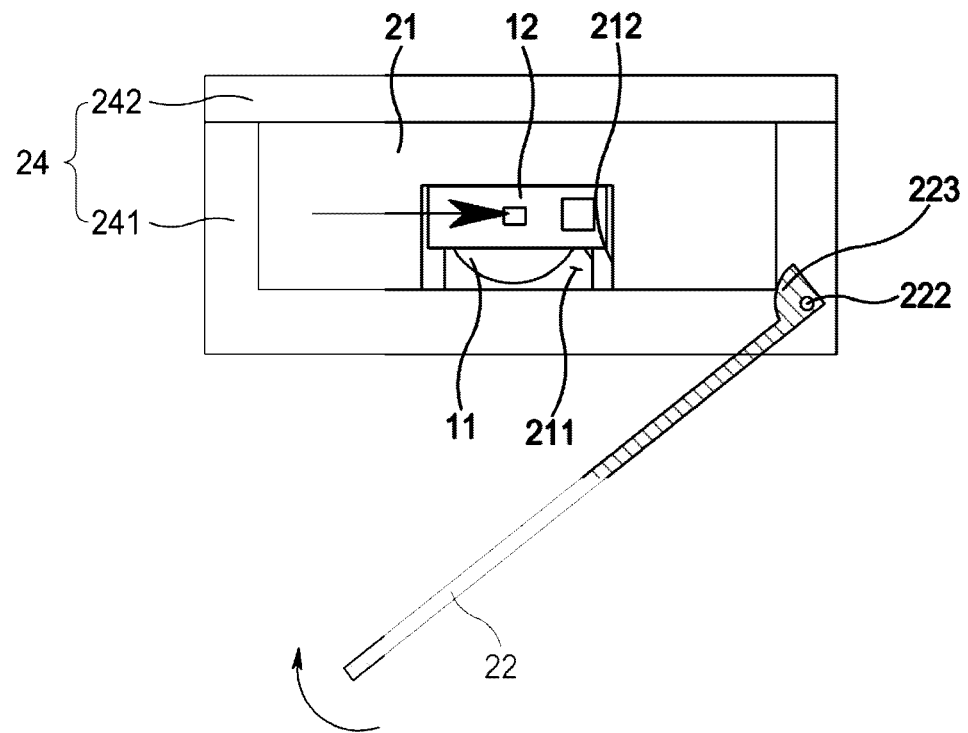
[FIG. 7]
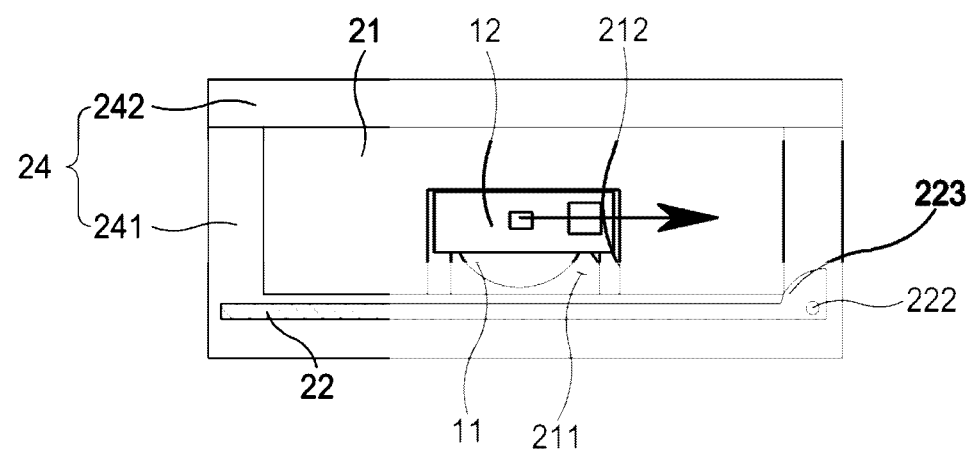

[FIG. 8]
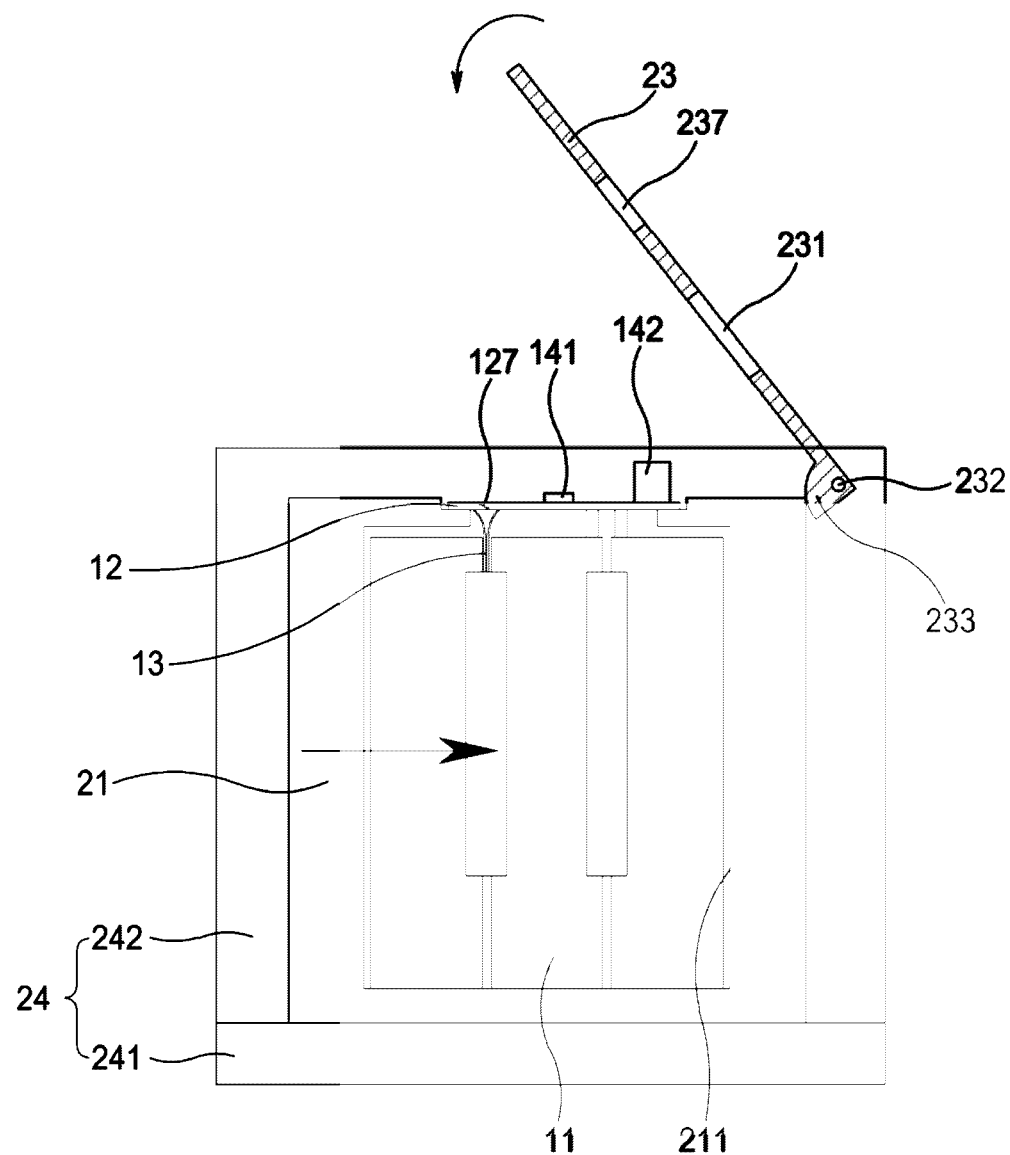

[FIG. 9]
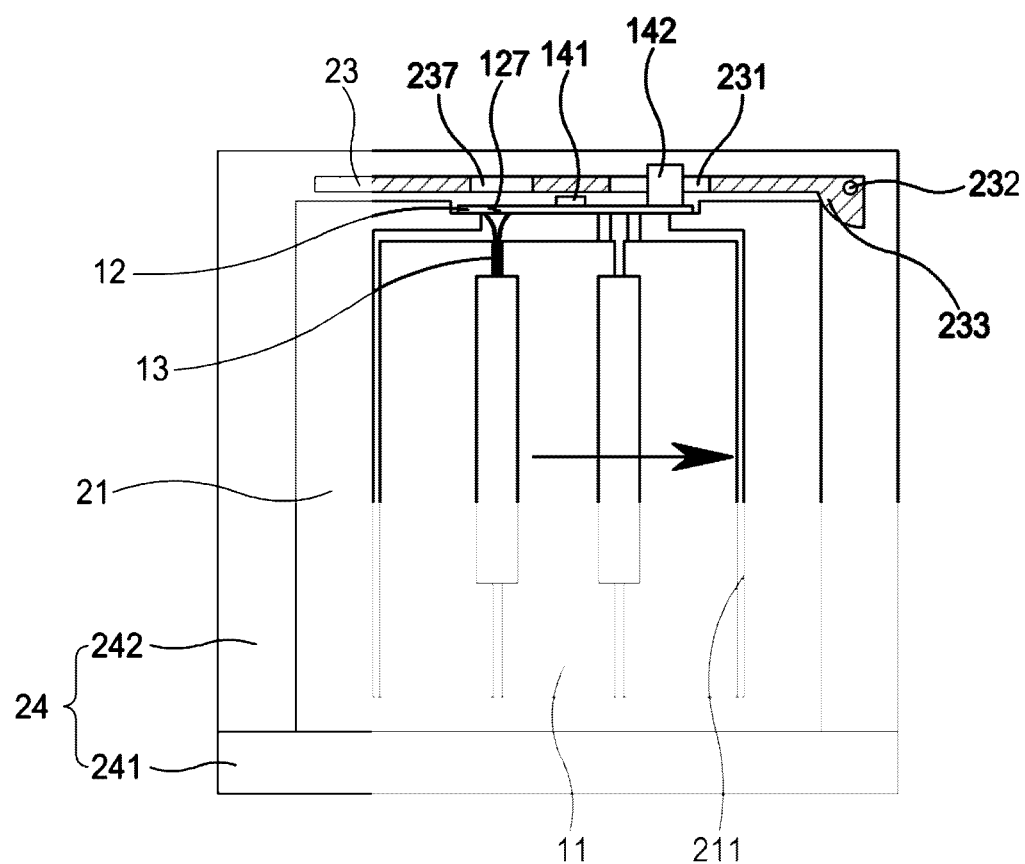

JIG FOR ASSEMBLY OF BATTERY MODULE

TECHNICAL FIELD

The present invention relates to a jig for assembly of a battery module, configured to support a battery cell and a circuit board during the process of electrically connecting the battery cell and the circuit board to each other in order to assemble a battery module.

BACKGROUND ART

In recent years, with an increase in the demand for portable electronic devices, such as laptop computers, smartphones, and tablet computers, research has been actively conducted on high-performance secondary batteries that are capable of being repeatedly charged and discharged.

In addition, secondary batteries have come to be widely used in middle- or large-sized devices, such as vehicles, robots, and satellites, as well as small-sized devices, such as portable electronic devices. In particular, as fossil fuels are being depleted and increasing attention is being paid to environmental pollution, research on hybrid vehicles and electric vehicles is being actively conducted. The most essential part of a hybrid vehicle or an electric vehicle is a battery pack configured to supply electric power to a motor. The battery pack includes a battery module, which includes a plurality of battery cells. The plurality of battery cells are connected to each other in series and/or in parallel, whereby the capacity and output of the battery module are increased.

The battery module includes a circuit board (for example, a battery management unit (BMU)) electrically connected to the battery cell and configured to control the battery cell. The circuit board is connected to the battery cell, for example, via a wire or a metal electrode (hereinafter, referred to as a connection member).

In the process of assembling the battery module, the connection member extending from the battery cell is attached to the circuit board by soldering using a soldering tool (a soldering iron) in the state in which the circuit board is disposed so as to be spaced apart from the battery cell by a predetermined distance. At this time, the soldering tool may push the circuit board, whereby the circuit board may be unintentionally moved. As the result of unintentional movement of the circuit board, the orientation (the position or the height) of the circuit board with respect to the battery cell may not be uniformly maintained, and the distance between the circuit board and the battery cell may not be uniformly maintained. In addition, the connection member may not be attached to a desired position on a soldering portion of the circuit board due to such problems.

DISCLOSURE

Technical Problem

The present invention has been made in view of the above problems, and it is an object of the present invention to provide a jig for assembly of a battery module, configured to support a battery cell and a circuit board that is electrically connected to the battery cell in the state of being spaced apart from each other such that the orientation of the circuit board with respect to the battery cell is maintained during the process of attaching a connection member to the circuit board, whereby the connection member is attached to a desired position on a soldering portion of the circuit board.

Technical Solution

In accordance with the present invention, the above and other objects can be accomplished by the provision of a jig for assembly of a battery module, the jig including a housing having a first accommodation portion configured to accommodate a battery cell and a second accommodation portion disposed so as to be spaced apart from the first accommodation portion, the second accommodation portion being configured to accommodate a circuit board in the state of being spaced apart from the battery cell, wherein the battery cell is accommodated in the first accommodation portion and the circuit board is accommodated in the second accommodation portion, whereby the orientation of the circuit board with respect to the battery cell may be maintained.

The housing may have an accommodation space partitioned by a partition wall as the first accommodation portion and an opening formed through the partition wall as the second accommodation portion, wherein the opening may be provided with a step portion, on which the circuit board is settled.

The jig may further include a first protective cover configured to cover the battery cell accommodated in the first accommodation portion.

The jig may further include a support unit, at which the housing is supported, wherein the first protective cover may be turnably connected to the support unit.

The first protective cover may be provided with a first contact portion configured to contact the housing, and the housing may be moved in the state of being in contact with the first contact portion, whereby the first protective cover may be turned to cover the battery cell accommodated in the first accommodation portion.

A first spring may be provided between the first protective cover and the support unit.

The jig may further include a second protective cover configured to cover the circuit board accommodated in the second accommodation portion, wherein the second protective cover may have therein a through-hole, through which a soldering portion of the circuit board, to which a connection member extending from the battery cell is attached, is exposed to the outside.

The second protective cover may include an element exposure hole, through which an element provided on the circuit board is exposed, and the element exposure hole may be formed so as to be spaced apart from the through-hole.

The jig may further include a support unit, at which the housing is supported, wherein the second protective cover may be turnably connected to the support unit.

The second protective cover may be provided with a second contact portion configured to contact the housing, and the housing may be moved in the state of being in contact with the second contact portion, whereby the second protective cover may be turned to cover the circuit board accommodated in the second accommodation portion.

A second spring may be provided between the second protective cover and the support unit.

Effects of the Invention

In the jig for assembly of the battery module according to the embodiment of the present invention constructed as described above, the battery cell is accommodated in the first accommodation portion, and the circuit board is accommodated in the second accommodation portion, which is disposed so as to be spaced apart from the first accommodation portion, in the state of being spaced apart from the battery cell. Even in the case in which external force is applied to the circuit board during the process of attaching the connection member to the soldering portion of the circuit board, therefore, the orientation (the position or the height) of the circuit board with respect to the battery cell may be stably maintained, unintentional movement of the circuit board may be prevented, the distance between the battery cell and the circuit board may be stably maintained, and the connection member may be attached to a desired position on the soldering portion of the circuit board.

BRIEF DESCRIPTION OF DRAWINGS

FIG. 1 is a side view schematically showing a battery module assembled using a jig for assembly of a battery module according to an embodiment of the present invention.

FIG. 2 is a perspective view schematically showing a housing of the jig for assembly of the battery module according to the embodiment of the present invention and a battery module.

FIG. 3 is an exploded perspective view schematically showing the housing and first and second protective covers of the jig for assembly of the battery module according to the embodiment of the present invention.

FIG. 4 is a perspective view schematically showing the housing and the first and second protective covers of the jig for assembly of the battery module according to the embodiment of the present invention.

FIG. 5 is an exploded perspective view schematically showing the jig for assembly of the battery module according to the embodiment of the present invention and the battery module.

FIGS. 6 and 7 are views schematically showing the state in which the housing and the first protective cover of the jig for assembly of the battery module according to the embodiment of the present invention are operated.

FIGS. 8 and 9 are views schematically showing the state in which the housing and the second protective cover of the jig for assembly of the battery module according to the embodiment of the present invention are operated.

DETAILED DESCRIPTION OF THE INVENTION

Hereinafter, a jig for assembly of a battery module according to an embodiment of the present invention will be described with reference to the accompanying drawings.

As shown in FIG. 1, a battery module 10, assembled using a jig for assembly of a battery module according to an embodiment of the present invention, includes at least one battery cell 11. However, the present invention is not limited as to the number of battery cells 11. For example, in the case in which the battery module 10 includes a plurality of battery cells 11, the plurality of battery cells 11 may be connected to each other by a casing or a fixing member 111.

The battery module 10 also includes a circuit board 12 connected to the battery cell 11. For example, the circuit board 12 may be a battery management unit (BMU). For example, the circuit board 12 may include a protection circuit. A plurality of elements 141 and 142 may be loaded on the circuit board 12. The plurality of elements 141 and 142 may include a resistor and a capacitor. The plurality of elements 141 and 142 may have different heights.

A connection member 13, such as a metal electrode or a wire, may extend from the battery cell 11. In the case in which a plurality of battery cells 11 are provided, the connection member 13 may electrically connect the plurality of battery cells 11 to each other.

The circuit board 12 is provided with a soldering portion 127, to which the connection member 13 is attached. An electrode, etc., connected to the connection member 13, may be provided at the soldering portion 127. The connection member 13 may be attached to the soldering portion 127 by soldering.

The battery module 10 is assembled such that the circuit board 12 is spaced apart from the battery cell 11 by a predetermined distance G. The circuit board 12 may be supported by the connection member 13, whereby the orientation (the position or the height) of the circuit board 12 with respect to the battery cell 11 may be maintained. That is, the distance G between the circuit board 12 and the battery cell 11 may be maintained as the result of the circuit board 12 being supported by the connection member 13. However, the present invention is not limited to the construction in which the circuit board 12 is supported by the connection member 13, and the circuit board 12 may be supported by a separate member.

As shown in FIG. 2, the jig for assembly of the battery module according to the embodiment of the present invention, denoted by reference numeral 20, serves to prevent unintentional movement of the circuit board 12 during the process in which the connection member 13 is attached to the soldering portion 127 of the circuit board 12. That is, the battery cell 11 and the circuit board 12 may be supported by the jig 20 for assembly of the battery module during the process of attaching the connection member 13 to the soldering portion 127 of the circuit board 12, whereby the orientation (the position or the height) of the circuit board 12 with respect to the battery cell 11, i.e. the distance G between the circuit board 12 and the battery cell 11, may be stably maintained.

The jig 20 for assembly of the battery module may include a housing 21 having a first accommodation portion 211, configured to accommodate the battery cell 11, and a second accommodation portion 212 disposed so as to be spaced apart from the first accommodation portion 211, the second accommodation portion 212 being configured to accommodate the circuit board 12. Consequently, the battery cell 11 may be accommodated in the first accommodation portion 211, and the circuit board 12 may be accommodated in the second accommodation portion 212, whereby the orientation (the position or the height) of the circuit board 12 with respect to the battery cell 11 may be stably maintained.

The housing 21 has an accommodation space partitioned by a partition wall 214 as the first accommodation portion 211. In addition, the housing 21 an opening formed through the partition wall 214 as the second accommodation portion 212. The second accommodation portion 212 (the opening) may be provided with a step portion 213, on which the circuit board 12 is settled.

The thickness T of the step portion 213 may be almost equal to or less than the distance G between the circuit board 12 and the battery cell 11. As a result, the step portion 213 may be interposed between the circuit board 12 and the battery cell 11. As the result of the step portion 213 being interposed between the circuit board 12 and the battery cell 11, the distance G between the circuit board 12 and the battery cell 11 may be stably maintained. Consequently, even in the case in which external force is applied to the circuit board 12, for example, when the circuit board 12 and/or the connection member 13 is pushed by a soldering tool (a soldering iron), the orientation (the position or the height) of the circuit board 12 with respect to the battery cell 11 may be stably maintained.

As shown in FIGS. 3 and 4, the jig 20 for assembly of the battery module may include a first protective cover 22 configured to cover the battery cell 11 accommodated in the first accommodation portion 211. The first protective cover 22 may serve to protect the battery cell 11 accommodated in the first accommodation portion 211 from the outside. In addition, the first protective cover 22 may serve to prevent the battery cell 11 from being arbitrarily separated from the first accommodation portion 211.

In addition, the jig 20 for assembly of the battery module may include a second protective cover 23 configured to cover the circuit board 12 accommodated in the second accommodation portion 212. The second protective cover 23 may serve to protect the circuit board 12 accommodated in the second accommodation portion 212 from the outside. In particular, the second protective cover 23 may serve to protect the element 141 on the circuit board 12 accommodated in the second accommodation portion 212 from the outside during the process of attaching the connection member 13 to the soldering portion 127. A through-hole 237, through which the soldering portion 127 of the circuit board 12 is exposed to the outside, may be formed in the second protective cover 23. The soldering tool may access the soldering portion 127 of the circuit board 12 through the through-hole 237, whereby the connection member 13 may be attached to the soldering portion 127 using the soldering tool. In addition, the second protective cover 23 may be provided with an element exposure hole 231, through which the element 142, the height of which is relatively large, among the plurality of elements 141 and 142, is exposed to the outside. Since the element 142 is exposed to the outside through the element exposure hole 231 in the state in which the second protective cover 23 covers the circuit board 12, therefore, the element 142 is prevented from colliding with the second protective cover 23. In addition, the element exposure hole 231 may be disposed so as to be spaced apart from the through-hole 237, whereby interference between the element 142 exposed through the element exposure hole 231 and the soldering tool may be prevented. Consequently, damage to the element 142 may be prevented during the process of attaching the connection member 13 to the soldering portion 127.

Meanwhile, as shown in FIG. 5, the jig 20 for assembly of the battery module may include a support unit 24, at which the housing 21 is supported. The housing 21 may be detachably supported at the support unit 24. The housing 21 may be supported at the support unit 24 in the state in which the battery module 10 is accommodated in the housing 21. The support unit 24 may include a first support block 241 and a second support block 242. The first support block 241 and the second support block 242 may be disposed at right angles to each other. The first support block 241 and the second support block 242 may be configured separably, or may be integrally formed.

The first protective cover 22 may be connected to the first support block 241 so as to be turnable about a first hinge shaft 222. As the result of the first protective cover 22 being turned about the first hinge shaft 222, the first protective cover 22 may cover the first accommodation portion 211, or may expose the first accommodation portion 211 to the outside. That is, the first protective cover 22 may be turned about the first hinge shaft 222 between a closing position, at which the first accommodation portion 211 is covered, and an opening position, at which the first accommodation portion 211 is exposed to the outside.

Meanwhile, the first protective cover 22 may be provided with a first contact portion 223 configured to contact the housing 21. The first contact portion 223 contacts a portion of the housing 21 when the housing 21 is moved in the state of being loaded on the support unit 24. As shown in FIG. 6, the first protective cover 22 may be turned about the first hinge shaft 222 as the result of the housing 21 being moved in the state of being in contact with the first contact portion 223. As shown in FIG. 7, therefore, the first protective cover 22 may cover the battery cell 11 accommodated in the first accommodation portion 211. In this way, the first protective cover 22 may be automatically turned and may then cover the battery cell 11 when the housing 21 is loaded on the support unit 24.

Meanwhile, a first spring 224 may be provided between the first protective cover 22 and the support unit 24 such that the first protective cover 22 can be returned to the original position thereof (the opening position) when the housing 21 is separated from the support unit 24, i.e. when the force that the housing 21 applies to the first protective cover 22 through the first contact portion 223 is released. When the housing 21 is separated from the support unit 24, therefore, the first protective cover 22 may be turned about the first hinge shaft 222 and returned to the opening position thereof by the elastic restoring force of the first spring 224.

In addition, the second protective cover 23 may be connected to the second support block 242 so as to be turnable about a second hinge shaft 232. As the result of the second protective cover 23 being turned about the second hinge shaft 232, the second protective cover 23 may cover the second accommodation portion 212, or may expose the second accommodation portion 212 to the outside. That is, the second protective cover 23 may be turned about the second hinge shaft 232 between a closing position, at which the second accommodation portion 212 is covered, and an opening position, at which the second accommodation portion 212 is exposed to the outside.

Meanwhile, the second protective cover 23 may be provided with a second contact portion 233 configured to contact the housing 21. The second contact portion 233 contacts a portion of the housing 21 when the housing 21 is moved in the state of being loaded on the support unit 24. As shown in FIG. 8, the second protective cover 23 may be turned about the second hinge shaft 232 as the result of the housing 21 being moved in the state of being in contact with the second contact portion 233. As shown in FIG. 9, therefore, the second protective cover 23 may cover the circuit board 12 accommodated in the second accommodation portion 212. In this way, the second protective cover 23 may be automatically turned and may then cover the circuit board 12 when the housing 21 is loaded on the support unit 24.

Meanwhile, a second spring 234 may be provided between the second protective cover 23 and the support unit 24 such that the second protective cover 23 can be returned to the original position thereof (the opening position) when the housing 21 is separated from the support unit 24, i.e. when the force that the housing 21 applies to the second protective cover 23 through the second contact portion 233 is released. When the housing 21 is separated from the support unit 24, therefore, the second protective cover 23 may be turned about the second hinge shaft 232 and returned to the opening position thereof by the elastic restoring force of the second spring 234.

In the jig for assembly of the battery module according to the embodiment of the present invention constructed as described above, the battery cell 11 is accommodated in the first accommodation portion 211, and the circuit board 12 is accommodated in the second accommodation portion 212, which is disposed so as to be spaced apart from the first accommodation portion 211, in the state of being spaced apart from the battery cell 11. Even in the case in which external force is applied to the circuit board 12 during the process of attaching the connection member 13 to the soldering portion 127 of the circuit board 12, therefore, the orientation (the position or the height) of the circuit board with respect to the battery cell 11 may be stably maintained, unintentional movement of the circuit board 12 may be prevented, the distance between the battery cell 11 and the circuit board 12 may be stably maintained, and the connection member 13 may be attached to a desired position on the soldering portion 127 of the circuit board 12.

Although the preferred embodiment of the present invention has been described by way of illustration, the scope of the present invention is not limited to the specific embodiment described herein, and the present invention can be appropriately modified within the category described in the claims.

DESCRIPTION OF REFERENCE NUMERALS

11: Battery cell
12: Circuit board
21: Housing
211: First accommodation portion
212: Second accommodation portion
22: First protective cover
23: Second protective cover
24: Support unit

The invention claimed is:

1. A jig for assembly of a battery module, the jig comprising:
    a housing having a first accommodation portion configured to accommodate a battery cell and a second accommodation portion disposed so as to be spaced apart from the first accommodation portion, the second accommodation portion being configured to accommodate a circuit board in a state of being spaced apart from the battery cell,
    wherein the battery cell is accommodated in the first accommodation portion, and the circuit board is accommodated in the second accommodation portion, whereby an orientation of the circuit board with respect to the battery cell is maintained.

2. The jig according to claim 1, wherein the housing includes:
    an accommodation space partitioned by a partition wall as the first accommodation portion; and
    an opening formed through the partition wall as the second accommodation portion,
    the opening being provided with a step portion, on which the circuit board is settled.

3. The jig according to claim 1, further comprising a first protective cover configured to cover the battery cell accommodated in the first accommodation portion.

4. The jig according to claim 3, further comprising:
    a support unit, at which the housing is supported,
    wherein the first protective cover is turnably connected to the support unit.

5. The jig according to claim 4, wherein:
    the first protective cover is provided with a first contact portion configured to contact the housing, and
    the housing is moved in a state of being in contact with the first contact portion, whereby the first protective cover is turned to cover the battery cell accommodated in the first accommodation portion.

6. The jig according to claim 5, wherein a first spring is provided between the first protective cover and the support unit.

7. The jig according to claim 1, further comprising a second protective cover configured to cover the circuit board accommodated in the second accommodation portion,
    wherein the second protective cover includes a through-hole that exposes a soldering portion of the circuit board to an outside, and
    wherein a connection member extending from the battery cell is attached to the soldering portion.

8. The jig according to claim 7, wherein:
    the second protective cover comprises an element exposure hole, through which an element provided on the circuit board is exposed, and
    the element exposure hole is formed so as to be spaced apart from the through-hole.

9. The jig according to claim 7, further comprising:
    a support unit, at which the housing is supported,
    wherein the second protective cover is turnably connected to the support unit.

10. The jig according to claim 9, wherein:
    the second protective cover is provided with a second contact portion configured to contact the housing, and
    the housing is moved in a state of being in contact with the second contact portion, whereby the second protective cover is turned to cover the circuit board accommodated in the second accommodation portion.

11. The jig according to claim 10, wherein a second spring is provided between the second protective cover and the support unit.

12. A battery module assembled using the jig according to claim 1.

13. A battery pack comprising a battery module assembled using the jig according to claim 1.

* * * * *